(12) United States Patent
Jackson et al.

(10) Patent No.: US 6,566,172 B1
(45) Date of Patent: May 20, 2003

(54) METHOD FOR MANUFACTURE OF FULLY SELF-ALIGNED TRI-LAYER A-SI:H THIN FILM TRANSISTORS

(75) Inventors: Thomas N. Jackson, State College, PA (US); Daniel B. Thomasson, Santa Rosa, CA (US)

(73) Assignee: The Penn State Research Foundation, University Park, PA (US)

( * ) Notice: Subject to any disclaimer, the term of this patent is extended or adjusted under 35 U.S.C. 154(b) by 0 days.

(21) Appl. No.: 09/103,206

(22) Filed: Jun. 23, 1998

(51) Int. Cl.[7] .......................... H01L 21/00; H01L 21/84
(52) U.S. Cl. .............. 438/149; 438/158; 438/FOR 184; 438/FOR 185
(58) Field of Search ................. 438/149, 158, 438/FOR 184, FOR 185

(56) References Cited

U.S. PATENT DOCUMENTS 5,696,011 A * 12/1997 Yamazaki
5,733,804 A * 3/1998 Hack et al.

OTHER PUBLICATIONS

Thomasson et al., Fully Self–Aligned Tri–Layer a–Si:H TFT with Deposted Doped Contact Layer, IEEE Electron Device Letters, vol. 19, No. 4, Apr. 4, 1998, IEEE, pp. 124–126.*

IEEE Electron Device Letters, vol. 18, No. 8, Aug. 1997, pp. 397–399, Daniel B. Thomasson et al., "High Mobility Tri–Layer a–Si:H Thin–Film Transistors with Ultrathin Active Layer".

IEEE Transactions on Electron Devices, vol. 36, No. 12, Dec. 1989, pp. 2883–2888, Heinz H. Busta et al., "Self–Aligned Bottom–Gate Submicrometer–Channel–Length a–Si:H Thin–Film Transistors".

IEICE Trans. Electron, vol. E79–C, No. 8, Aug. 1996, pp. 1103–1203, Naoto Hirano et al., "A 33–cm–Diagonal High Resolution TFT–LCD with Fully Self–Aligned a–Si TFTs".

* cited by examiner

*Primary Examiner*—Long Pham
*Assistant Examiner*—Khiem D Nguyen
(74) *Attorney, Agent, or Firm*—Ohlandt, Greeley, Ruggiero & Perle, L.L.P.

(57) ABSTRACT

The method of the invention configures a tri-layer thin film transistor (TFT) on a substrate, the TFT including a stack including a gate electrode supported by the substrate, followed by a first layer of insulator, a layer of semiconductor and a second layer of insulator. The method employs a first step of illumination through the substrate, as shadowed by said gate electrode, to enable a patterning of the second layer of insulator into an insulator patch which is aligned with the gate electrode. A next step of illumination through the substrate, as shadowed by said gate electrode, enables a patterning of metallization contacts for the TFT in alignment with the insulator patch.

5 Claims, 9 Drawing Sheets

- Gate deposition & pattern (Mask 1)
- SiN/a-Si:H/n+ deposition
- Define channel (BE1)

- Contact metal depositon & liftoff

- Pattern contact areas (Mask 2)
- n+ etch

Fig. 3

- Gate deposition & pattern (Mask 1)
- Tri-layer deposition
- Define channel (BE1)

- Ion doping of n⁺ regions

- Pattern contact areas (Mask 2)

METHOD FOR MANUFACTURE OF FULLY SELF-ALIGNED TRI-LAYER A-SI:H THIN FILM TRANSISTORS

FIELD OF THE INVENTION

This Invention relates to an improved method for the manufacture of thin film transistors (TFTs) and, more particularly, to a method for the manufacture of fully self-aligned TFTs wherein back illumination is utilized to accomplish the configuration of TFT contact regions and metallization.

BACKGROUND OF THE ART

Figure 1:
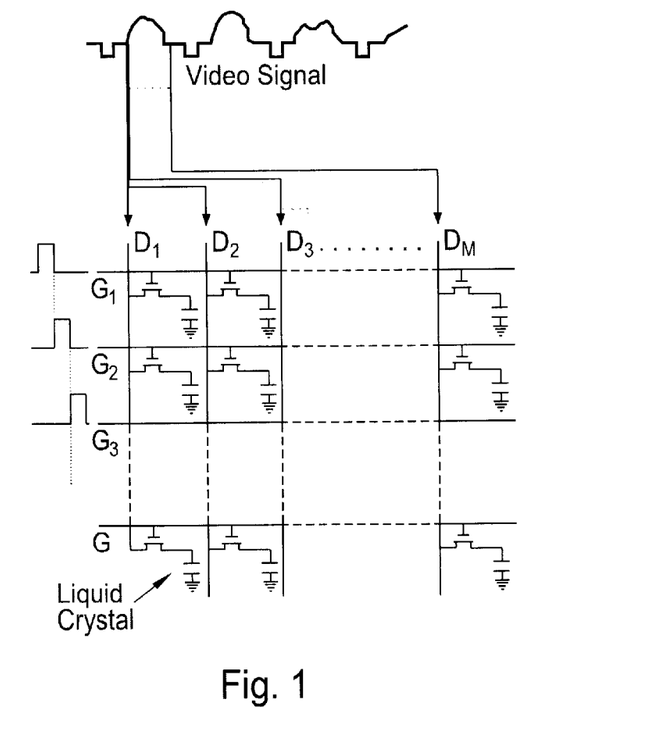
FIG. 1 is a schematic of a prior art addressing scheme used with a typical active matrix liquid crystal display.

TFTs, using hydrogenated amorphous silicon (a-Si:H) as the active material, are widely used in large area electronics applications e.g., active matrix liquid crystal displays (AMLCDs). A typical AMLCD addressing scheme is shown in FIG. 1. There, a TFT T is used to charge each pixel capacitance C to a voltage specified by the video signal. Since the TFT controls the charging voltage, improvements in display size, greyscale, and resolution depend on maximizing TFT performance and minimizing parasitic effects associated with the staggered-inverted TFT structure that is typically used for AMLCDs (see FIG. 2).

Figure 2:
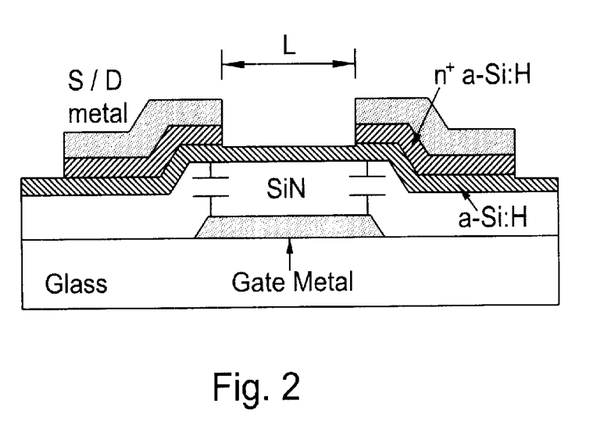
FIG. 2 is a sectional view of a prior art staggered-inverted TFT that has been back channel etched (BCE).

TFT 10 comprises a glass substrate 12 on which a gate electrode 12 has been deposited. A silicon nitride layer 14 is positioned between gate electrode 12 and a thin semiconductor layer 18 of hydrogenated amorphous silicon (a-Si:H). Source and drain interface layers 20 and 22 are comprised of n+ doped a-Si:H and are covered by metallization layers 24 and 26, respectively. The distance L defines the approximate conduction channel length within active layer 18.

Self-aligned (SA) TFT structures have been of interest for several years because they benefit performance and minimize parasitic effects. Such structures can allow a TFT conduction channel length L reduction which increases the capacitance charging currents, and a minimization of contact overlap which reduces the TFT parasitic capacitance. Previously demonstrated SA-TFT structures have not been widely adopted in display manufacturing, though, because they require more complicated manufacturing processes.

Though SA-TFTs have been demonstrated for a-Si:H TFTs, previous SA-TFTs have had the disadvantage of increased process complexity, limited device performance, or both. The two most common staggered-inverted TFT structures are the back-channel etched TFT (BCE-TFT) and the tri-layer/i-stopper TFT. The standard BCE-TFT usually requires fewer processing steps than a conventional tri-layer TFT process, but involves a critical etch step that limits the minimum a-Si:H thickness- which, in turn, limits the device performance. Tri-layer TFTs typically have better electrical performance, but require an additional material deposition step and an additional photolithography mask step.

Figure 3:
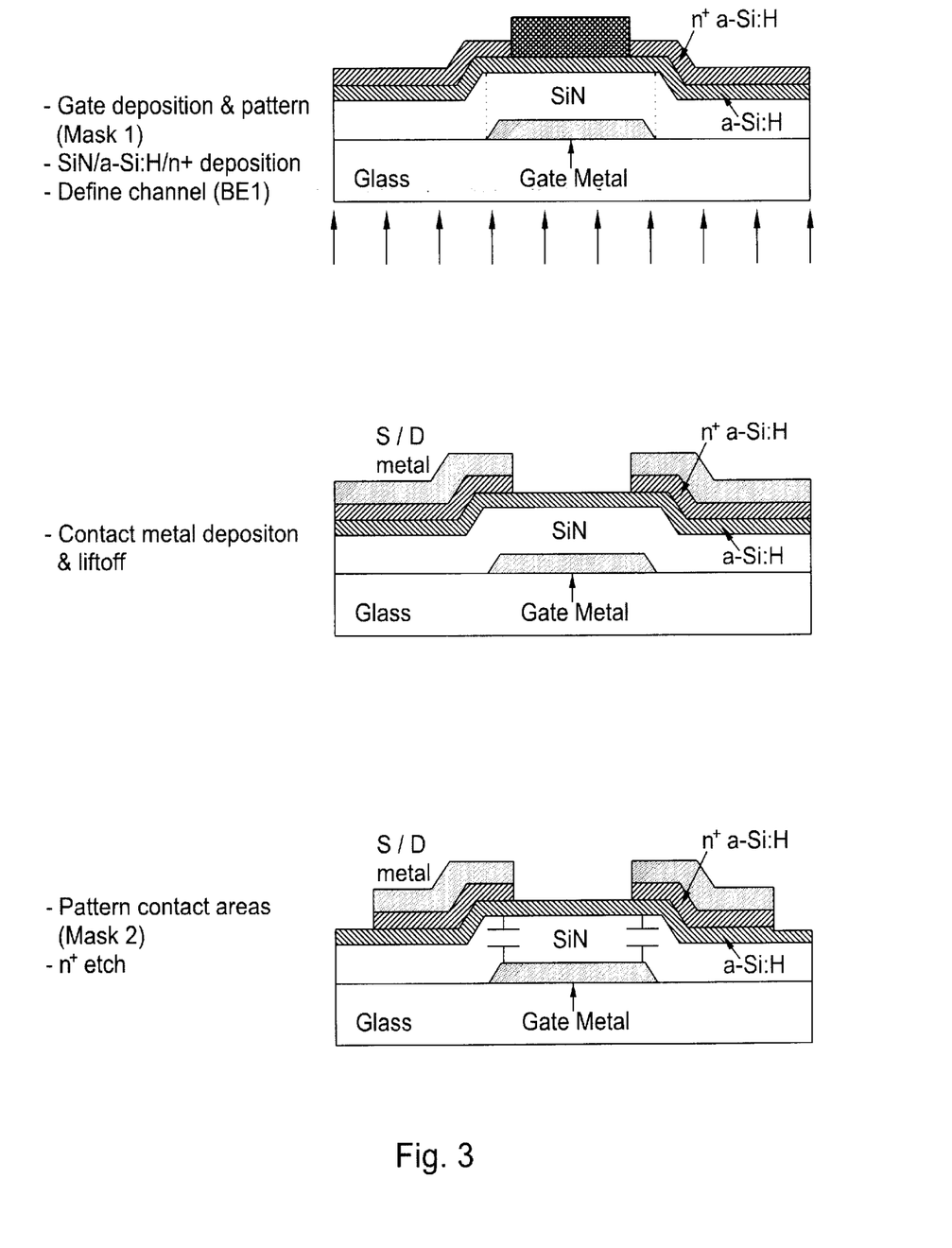
FIG. 3 is schematic of certain steps of a prior art process for construction of a self-aligned, BCE-TFT.

The self-aligned BCE-TFT process is described by Busta et al. in "Self-Aligned Bottom Gate Submicrometer Channel Length a-Si:H Thin Film Transistors" Trans. On Electron Devices, Vol. 36, No. 12, pp 2883–2888, 1989. FIG. 3 shows the process for making such a self-aligned BCE-TFT. The process allows channel length minimization (determined only by the minimum gate dimension), but requires relatively thick (>~60 nm) a-Si:H layers. Since very thin a-Si:H layers can improve TFT extrinsic mobility, thicker a-Si:H layers constrain the self-aligned BCE-TFT performance.

Figure 4:
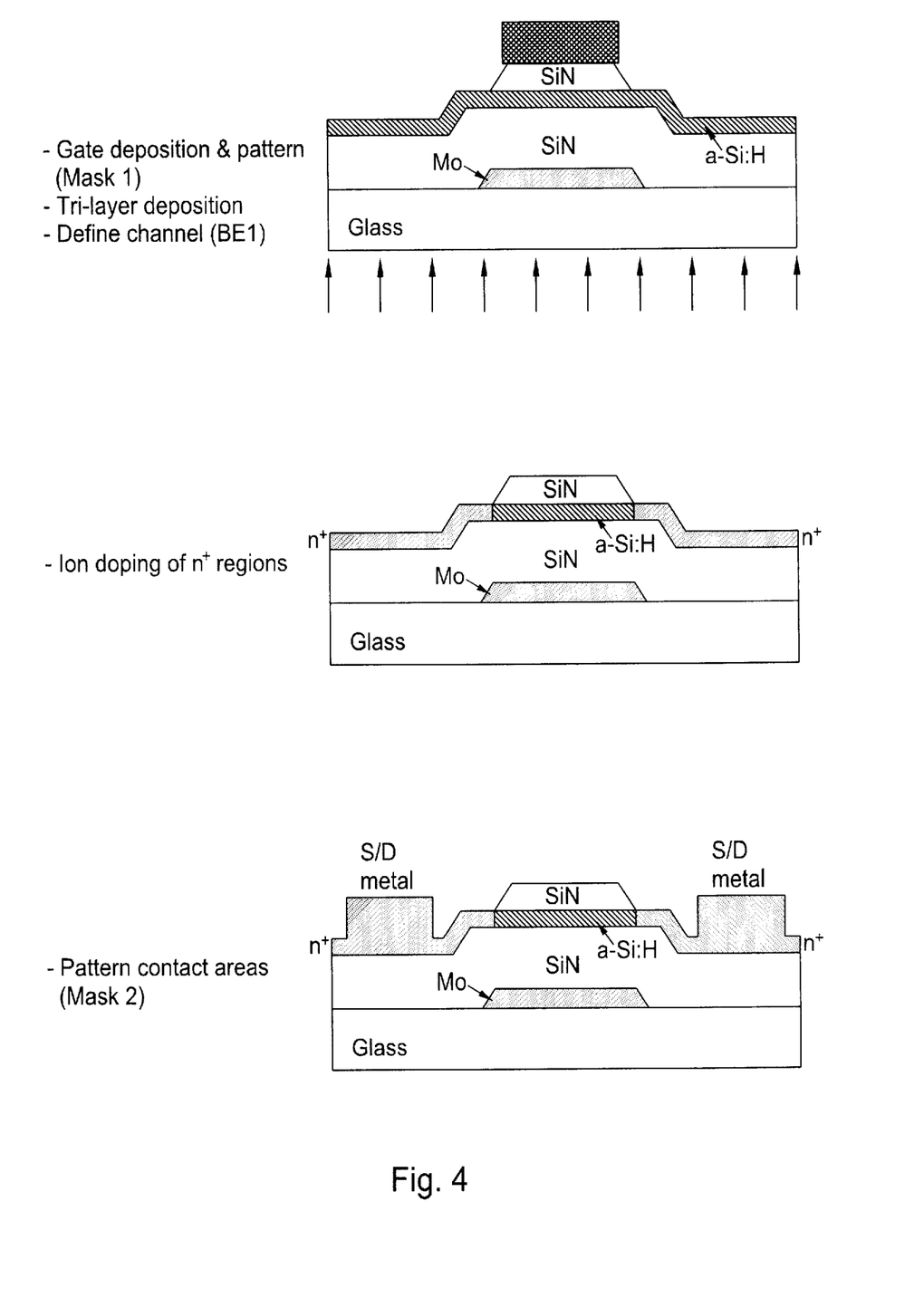
FIG. 4 is schematic of certain steps of a prior art process for construction of a fully self-aligned TFT.

To achieve self-alignment for high-performance TFTs, fully self aligned (FSA) tri-layer TFT processes have also been demonstrated. FIG. 4 shows a method for fabricating FSA tri-layer TFTs using an ion shower doping step. While this process does result in a minimum channel length determined only by a minimum gate dimension, and the increased performance associated with tri-layer devices, it requires an ion doping process which has not been used in AMLCD manufacturing, and is not commercially available for large area applications.

Figure 5:
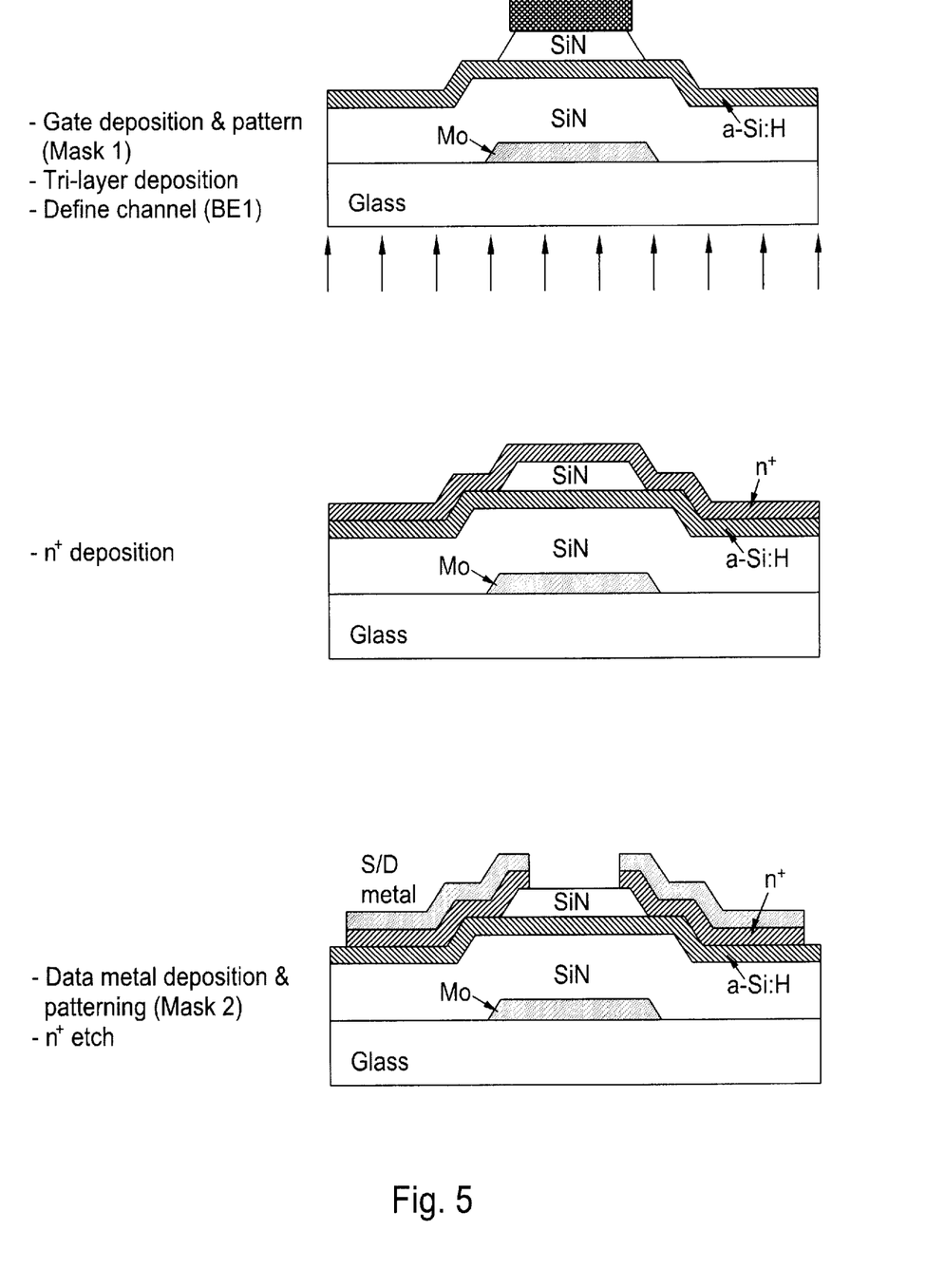
FIG. 5 is schematic of certain steps of a prior art process for construction of a semi-self-aligned try-layer TFT.

Another method for fabricating SA tri-layer TFTs is shown in FIG. 5. Instead of using an ion shower doping step, additional photolithography mask steps are used to define contact regions of the TFT, allowing a deposited $n^+$ contact layer to be used. Though this process can be used to fabricate semi-SA tri-layer TFTs, the additional mask steps result in a minimum channel length that is determined by not only the gate dimension, but also the contact region alignment tolerances and the minimum spacing of the contact photolithography.

Accordingly, it is an object of the invention to produce an FSA tri-layer TFT wherein channel length is determined by minimum photolithographic dimensions and not by contact region alignment tolerances.

It is a further object of the invention to produce an FSA tri-layer TFT wherein contact region placement is a direct function of gate electrode placement.

SUMMARY OF THE INVENTION

The method of the invention configures a tri-layer thin film transistor (TFT) on a substrate, the TFT including a stack including a gate electrode supported by the substrate, followed by a first layer of insulator, a layer of semiconductor and a second layer of insulator. The method employs a first step of illumination through the substrate, as shadowed by said gate electrode, to enable a patterning of the second layer of insulator into an insulator patch which is aligned with the gate electrode. A next step of illumination through the substrate, as shadowed by said gate electrode, and using a photolithographic mask, enables a patterning of metallization contacts for the TFT in alignment with the insulator patch.

DETAILED DESCRIPTION OF THE PREFERRED EMBODIMENT

Figure 6A:
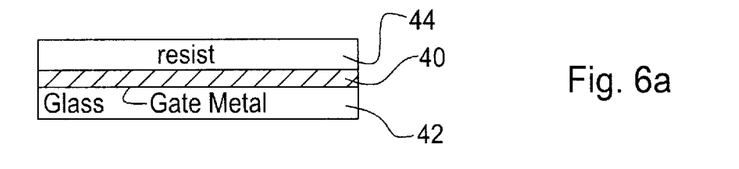
FIGS. 6a–6r illustrate the steps of the invention hereof.
Figure 6B:
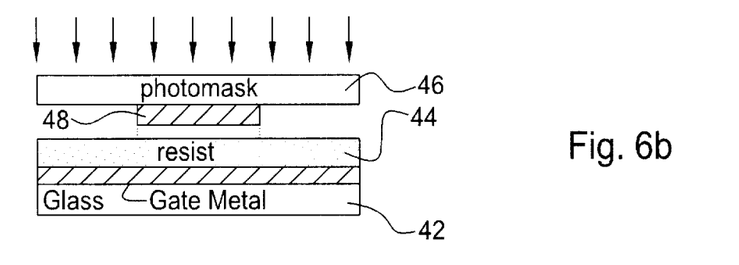
Figure 6C:
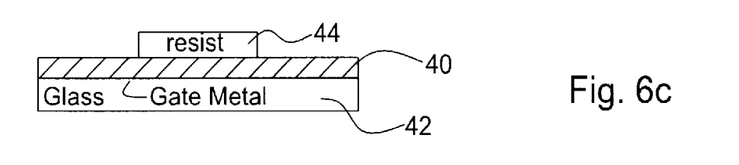
Figure 6D:
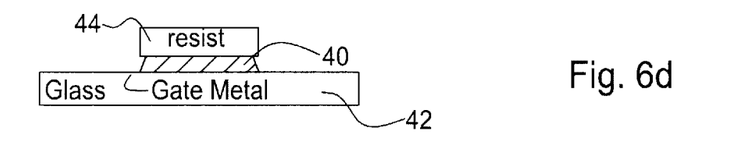
Figure 6E:
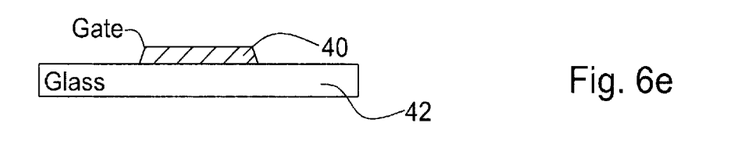
Figure 6F:
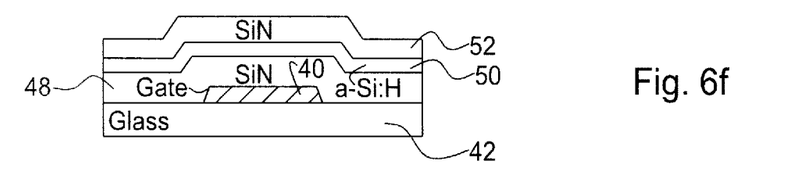
Figure 6G:
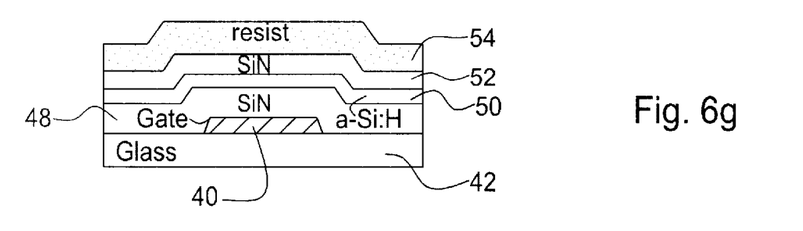
Figure 6H:
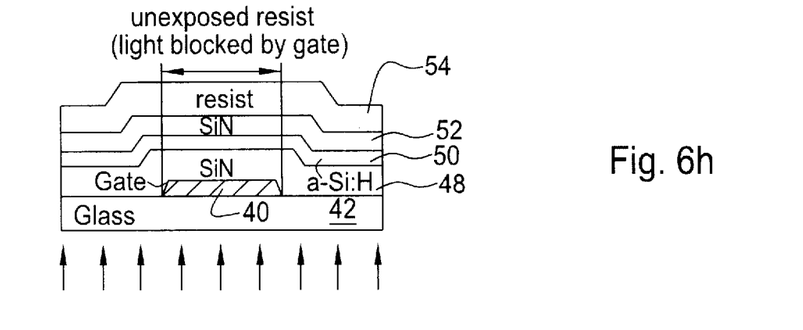
Figure 6I:
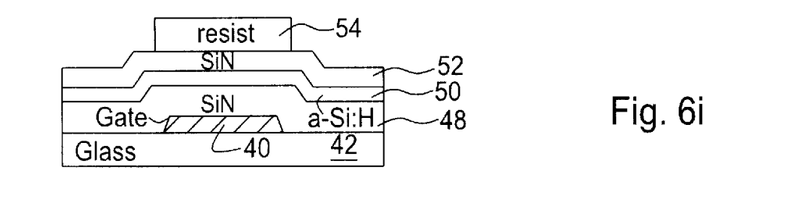
Figure 6J:
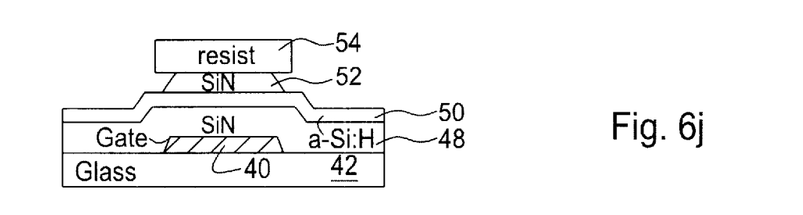
Figure 6K:
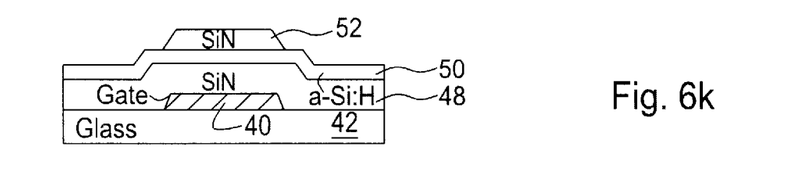
Figure 6L:
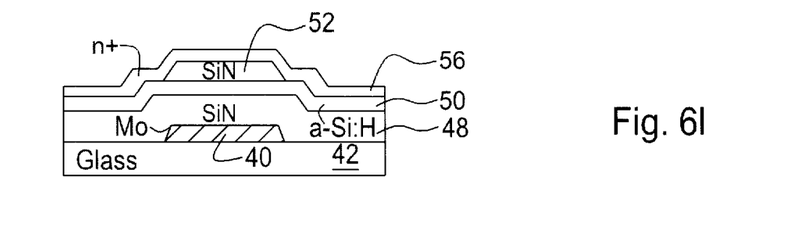
Figure 6M:
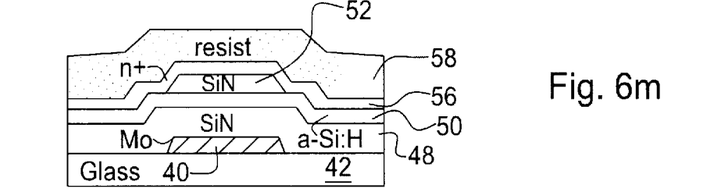
Figure 6N:
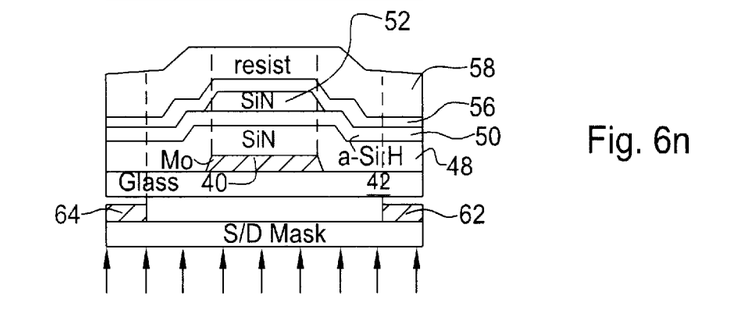
Figure 6O:
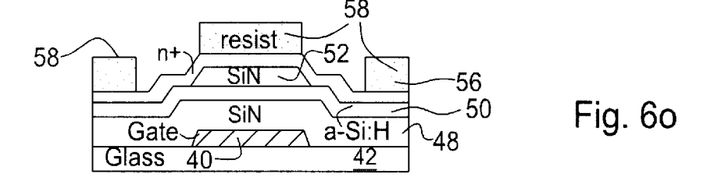
Figure 6P:
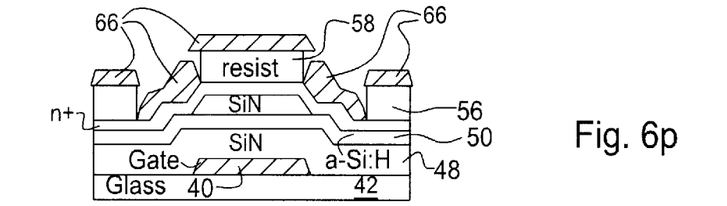
Figure 6Q:
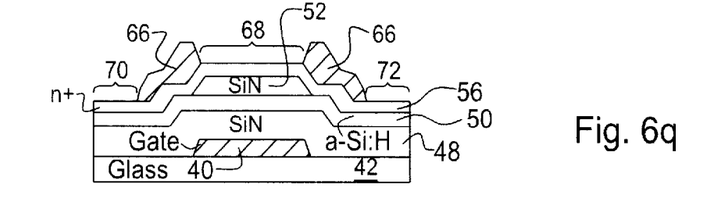
Figure 6R:
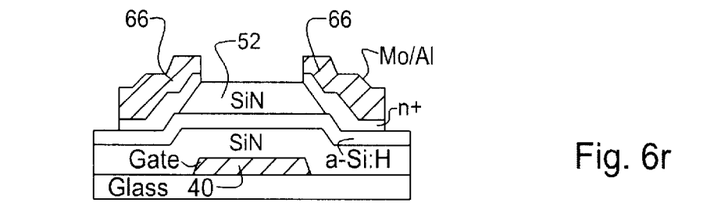

The process shown in FIGS. 6a–6r is used to fabricate FSA tri-layer TFTs with a deposited n+ contact layer, the structure of which is described by Applicants in "Fully Self-Aligned Tri-layer a-Si:H TFT with Ultra-Thin Active Layer," 55th Device Research Conference, pp. 50–51, June 1997.

In brief, the process of the invention employs two backside exposure steps to achieve full self-alignment (channel definition requiring no precise contact alignment). As with the other semi-aligned processes, the top SiN layer is patterned by a backside exposure step. Then, an n+ contact layer is deposited and the contact areas are defined by a second backside exposure step. The second backside exposure step uses the gate electrode to define the channel, and during the same exposure, a mask or projection lithography is used on the backside of the substrate to define the contact areas. The contact metallization is then deposited, the remaining resist is lifted off, and the n+ regions outside the contacts are removed by reactive ion etching. Accordingly the invention enables, fully self-aligned (FSA) tri-layer TFTs to be fabricated without ion doping, and with the minimum channel length determined only by the minimum photolithographic dimension.

Referring now to FIGS. 6a–6r, details of the method of the invention will be described. Initially (FIG. 6a), a layer of the metal 40 is deposited on a transparent substrate 42 which may be either glass or a transparent polymer. A photoresist 44 is applied to gate metal 40 and thereafter is exposed through a photomask 46 that includes opaque region 48 (FIG. 6b). Next, exposed photoresist 44 is developed and gate metal 40 is etched to define the gate electrode structure (FIGS. 6c, 6d). Thereafter, photoresist 44 is removed and a tri-layer stack of silicon nitride layer 48, a-Si:H layer 50 and silicon nitride layer 52 are deposited over gate structure 40. A photoresist layer 54 is applied over silicon nitride layer 52 (FIGS. 6f, 6g).

At this point, photoresist layer 54 is exposed by ultraviolet illumination through glass substrate 42, as shadowed by gate structure 40 (FIG. 6h). Photoresist layer 54 is then developed, the portions of silicon nitride layer 52 which are thereby exposed are etched away and the remainder of photoresist 54 is removed (FIGS. 6i, 6j and 6k). Next, a layer of n+ doped amorphous silicon 56 is laid down over a-Si:H layer 48 (FIG. 6l), followed by deposition of a layer of photoresist 58 (FIG. 6m). A mask 60 is then overlaid on glass substrate 42 to enable the patterning of the source and drain regions of the TFT structure. Mask 60, accordingly, includes opaque regions 62 and 64 that are positioned to coincide with the source and drain regions (FIG. 6n). Note that while a contact mask 60 is illustrated, a mask pattern can be projected on glass substrate 42, in the known manner. After the placement of mask 60, UV light is directed through glass substrate 42 into the TFT structure so as to expose photoresist layer 58 (as it is shadowed by gate structure 40 and opaque regions 62 and 64).

Thereafter, photoresist layer 58 is developed and a layer of metallization 66 is deposited thereover (FIGS. 6n, 6o). Note that at this stage, the back exposure of the TFT structure has enabled drain and source contact metallization 66 to be deposited without the requirement of any top-side lithography. Further, the arrangement of contact metallization 66 is directly dependent upon and in alignment with the position of gate electrode 40 and opaque regions 62 and 64.

Next, the remaining sections of photoresist layer 58 are removed, causing a lift-off of metallization 66 that is deposited thereon, leaving the source and drain metallizations (FIGS. 6p, 6q). Finally, area 68 of n+doped amorphous silicon layer 56 which overlays silicon nitride cap 52, as well as areas 68 and 70, are removed by etching (FIG. 6r). An additional step, not shown, may be used to isolate the active TFT areas.

Experimental Results

Figure 7:
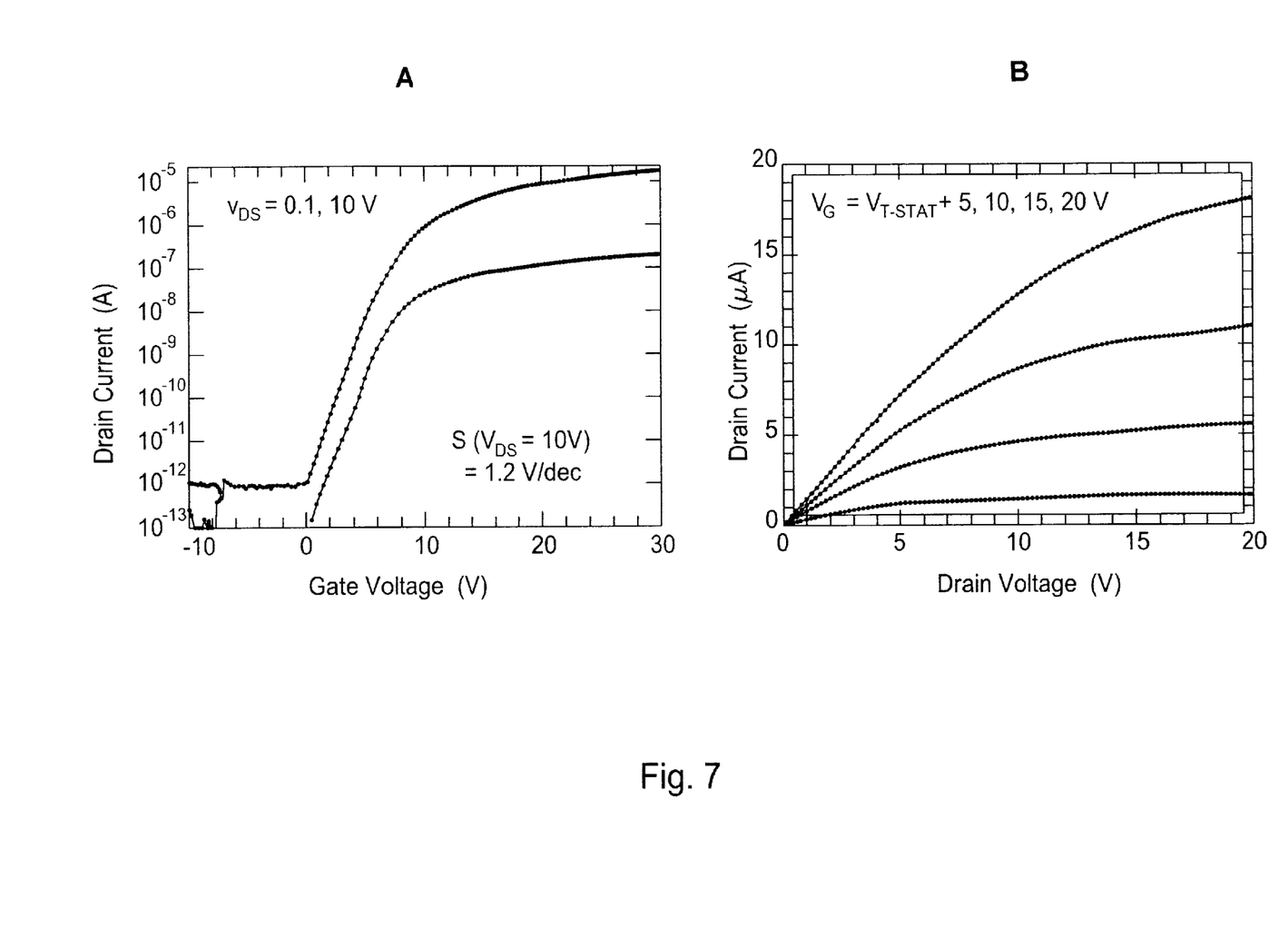
FIG. 7a is a plot of drain current versus gate voltage for a fully self-aligned try-layer TFT constructed in accord with the invention.
FIG. 7b is a plot of drain current versus drain voltage for a fully self-aligned tri-layer TFT constructed in accord with the invention.

Fully self-aligned tri-layer a-Si:H TFTs have been fabricated with excellent device performance, and contact overlaps<1.□ m. As shown in FIGS. 7a and 7b, the devices have excellent electrical characteristics. The plot of the drain current versus gate voltage demonstrates low off currents (<1 pA), and an on/off current ratio>$10^7$. The plot of drain current versus drain voltage shows that the contact regions are ohmic and large output currents are obtained.

Figure 8:
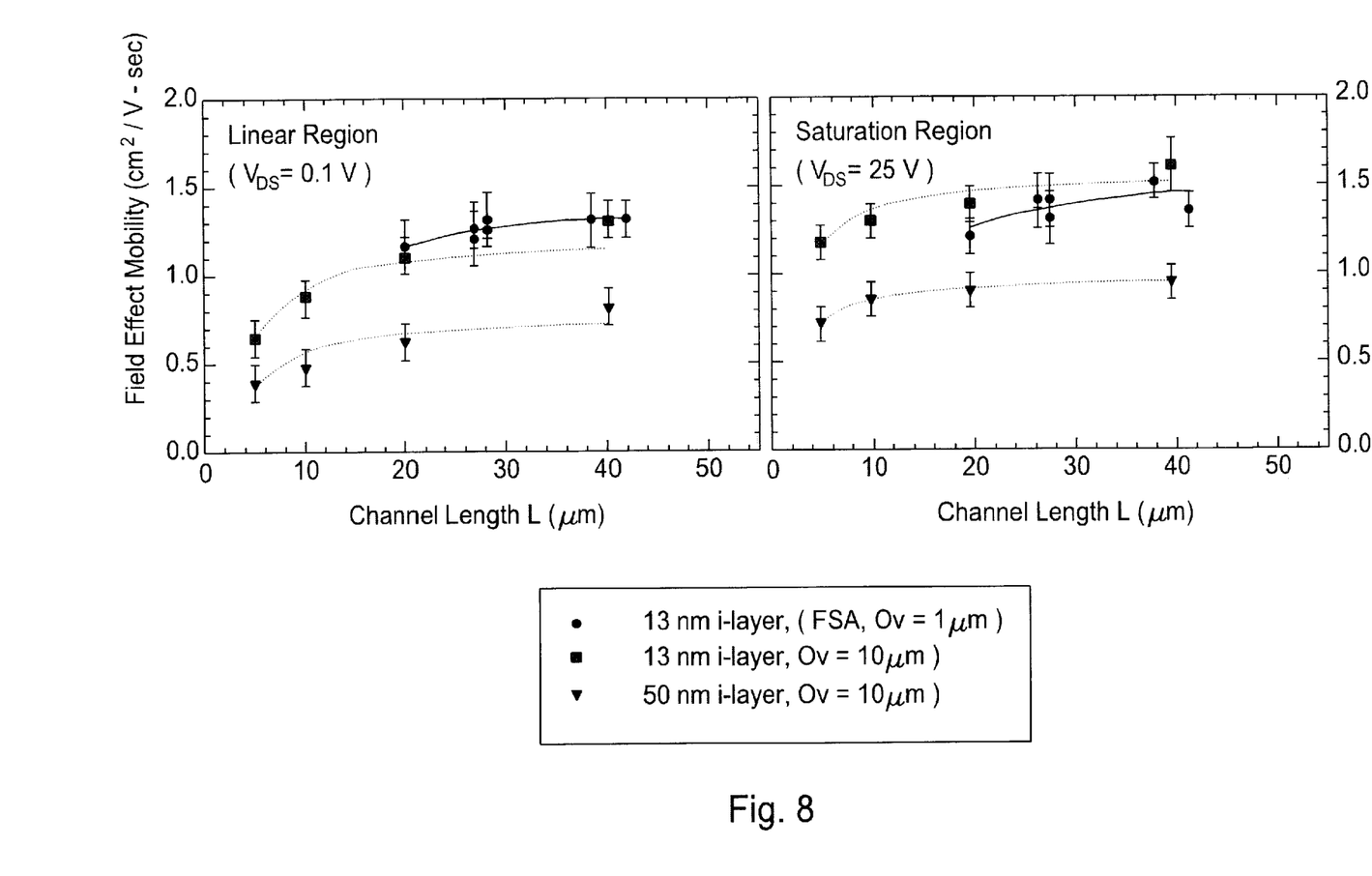
FIG. 8 is a plot of field effect mobility versus channel length L for both fully self aligned and standard TFTs.

FIG. 8 shows a comparison of extrinsic mobility versus channel length for the fully self-aligned devices (13 nm a-Si:H) and standard tri-layer TFTs (13 nm and 50 nm a-Si:H) which have contact overlaps of 10□ m. Due to maskset availability, channel lengths for the FSA-TFTs were limited to about 20□ m, but the mobilities were quite high. The FSA-TFT mobilities were similar to those obtained for the standard 13 nm a-Si:H TFTs, and significantly higher than those for 50 nm TFTs.

Though thicker (50 nm) a-Si:H layers will work in the FSA process, an ultra-thin (13 nm) a-Si:H layer was incorporated in these FSA TFTs to demonstrate the compatibility of the FSA process with very high performance TFT structures. The method of the invention benefits AMLCD TFT manufacturing in several ways. With similar process complexity as conventional TFT manufacturing, the method of the invention can be used to fabricate high performance, short channel length tri-layer TFTs with minimized parasitic effects and avoids the problems associated with contact region photolithograpy tolerances. Thus, avoided are the parasitic effects and long channel lengths associated with conventional TFT structures limit the performance of AMLCDs.

It should be understood that the foregoing description is only illustrative of the invention. Various alternatives and modifications can be devised by those skilled in the art without departing from the invention. For example, while the invention has been described in the context of the manufacture of a tri-layer TFT, it is equally applicable to other structures, such as bilayer TFTs, other semiconductor devices and other structures which are transparent to the illuminating radiation. Accordingly, the present invention is intended to embrace all such alternatives, modifications and variances which fall within the scope of the appended claims.

What is claimed is:

1. A method for forming a tri-layer thin film transistor on a substrate, said tri-layer thin film transistor including a stack comprising a gate electrode supported by said substrate, followed by a first insulation layer, a semiconductor layer and a second insulation layer, said method comprising the steps of:

(a) patterning said second insulation layer into an insulation patch which is aligned with said gate electrode;

(b) depositing a doped semiconductor layer, wherein said doped semiconductor layer is deposited on said insulator patch and said semiconductor layer;

(c) applying a mask under said substrate; and (d) patterning metallization contacts on said doped semiconductor layer, which are aligned with said insulator patch and said mask, by i.) applying a resist layer on said doped semiconductor layer;

ii.) exposing said resist layer by backside illumination that has been masked as shadowed by said gate electrode and said mask;

iii.) removing areas of said resist layer exposed to said illumination;

iv.) depositing a layer of metallization on said resist layer and said doped semiconductor layer; and v.) removing said resist layer and said metallization layer deposited thereon to form contact to source and drain regions of said tri-layer thin film transistor.

2. The method as recited in claim 1, wherein step d) masks said illumination in selected regions so as to form metallization contacts in regions exposed by said illumination.

3. The method as recited in claim 1, wherein step a) comprises the following steps:

i) applying a resist layer on said second insulation layer;

ii) exposing said resist, by said first illumination as shadowed by said gate electrode;

iii) removing exposed areas of said resist; and iv) removing regions of said second insulator layer to create said insulator patch.

4. The method as recited in claim 1 comprising the following added step:

removing exposed areas of said doped semiconductor layer that overlay said insulator patch and said semiconductor layer, using said metallization as a mask.

5. A method for forming a structure on a substrate, said structure including a stack comprising multiple layers with at least one opaque feature incorporated therein, said multiple layers supported by a substrate, and having a layer of photoresist on an upper surface thereof, said method comprising the steps of:

illuminating said stack through said substrate with radiation that is projected through a mask thereby patterning an exposure of said photoresist in accord with said mask features and said opaque feature;

developing said photoresist; and processing portions of said upper surface of said stack exposed by said illumination.

* * * * *